(12) United States Patent
Bush et al.

(10) Patent No.: US 6,469,316 B1
(45) Date of Patent: Oct. 22, 2002

(54) TEST STRUCTURE TO MONITOR THE EFFECTS OF POLYSILICON PRE-DOPING

(75) Inventors: John J. Bush, Leander; Mark I. Gardner, Cedar Creek; David E. Brown, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/756,523

(22) Filed: Jan. 8, 2001

(51) Int. Cl.$^7$ .............................................. H01L 23/58
(52) U.S. Cl. ........................................ 257/48; 257/401
(58) Field of Search .................................... 257/48, 401

(56) References Cited

U.S. PATENT DOCUMENTS 5,986,283 A * 11/1999 Bush et al. .................. 257/48
6,232,619 B1 * 5/2001 Chen ........................... 257/48

OTHER PUBLICATIONS

Stanley Wolf and Richard N. Tauber; *Silicon Processing for the VLSI Era*, vol. 2—Process Integration; pp. 298–313, 66; 1990.

* cited by examiner

*Primary Examiner*—Jerome Jackson, Jr.
(74) *Attorney, Agent, or Firm*—Timothy M. Honeycutt

(57) ABSTRACT

Various embodiments of a test circuit and methods of fabricating and using the same are provided. In one aspect, a test circuit includes a semiconductor substrate and a mask thereon that has an opening to enable impurity doping of selected portions of the test circuit. A plurality of circuit devices are provided on the substrate that have respective active regions positioned at staggered known distances from the mask opening. Each of the plurality of circuit devices has a gate electrode that extends to the opening and has a first impurity region of a first conductivity type and a second impurity region of a second and opposite conductivity type. Where the predicted on-state output current of a given circuit device exceeds an actual output current of the given circuit device, there is indication of an overlap between the first and second impurity regions of the gate electrode of the given device.

16 Claims, 5 Drawing Sheets

TEST STRUCTURE TO MONITOR THE EFFECTS OF POLYSILICON PRE-DOPING

BACKGROUND OF THE INVENTION

1. Field of the Invention

This invention relates generally to semiconductor processing, and more particularly to test structures for detecting counterdoping in integrated circuits and to methods of making and using the same.

2. Description of the Related Art

In complimentary metal oxide semiconductor ("CMOS") circuit structures, n-channel and p-channel transistors are fabricated in huge quantities to implement a large variety of different circuit structures on a semiconductor substrate. In many cases, the p-channel and n-channel transistors are fabricated in relatively close proximity, there being a physical separation between the two devices only by a trench isolation structure or field oxide region. In many conventional fabrication processes, the transistor gate electrodes for both the p-channel and n-channel devices are fabricated from polysilicon lines that are patterned from a bulk deposited polysilicon film. Thereafter, the polysilicon gates are rendered conductive by either source/drain region impurity implants or by a separate implant dedicated to gate doping.

Early CMOS transistor pairing involved the n-type or p-type doping of both the p-channel and n-channel field effect transistor gates. More modem techniques routinely involve the implanting of p-channel transistor gate electrodes with p-type impurities and the n-channel transistor gates with n-type impurities, usually through the use of alternating masking of the p-channel and n-channel active regions. In addition, a so-called "poly pre-doping" implant is sometimes performed on the n-channel transistor gate electrodes in order to further enhance their performance, that is, to improve their threshold voltage and drive current characteristics.

In conventional practice, the poly pre-doping of n-channel devices is accomplished by applying a photoresist layer, usually negative tone, and thereafter forming an opening in the resist using standard lithography techniques. The layout of the mask opening will generally overlap substantial portions of the n-channel transistor gate electrodes. However, particularly in those circumstances where the n-channel and p-channel devices share a common polysilicon line functioning as a transistor gate electrode, there exists the propensity for diffusion of n-type impurities longitudinally through the shared transistor gate electrode from the n-channel side toward the p-channel devices. This diffusion of n-type impurities into the device regions of the p-type transistors may lead to a counterdoping of the p-type transistor gates and an attendant skewing of the threshold voltage and/or other operating characteristics of the p-channel transistors.

While the extent of opposite conductivity type impurity diffusion toward the p-channel devices following the poly pre-doping implant is a function of several parameters, one critical factor is the location of the edge of the polysilicon pre-doping photomask opening relative to the p-channel transistors. Currently, the relative spacing between p-channel devices and the edge of a poly pre-doping mask opening for the n-channel transistor poly pre-doping implant is determined empirically and involves some degree of guess work. Obviously, if the amount of diffusion of n-type impurities toward the p-channel device regions is greater than anticipated, counterdoping and device performance drop off may be the unintended result.

The present invention is directed to overcoming or reducing the effects of one or more of the foregoing disadvantages.

SUMMARY OF THE INVENTION

In accordance with one aspect of the present invention, a test circuit is provided that includes a semiconductor substrate and a mask on the substrate that has an opening with an edge. The opening is to enable impurity doping of selected portions of the test circuit. A plurality of circuit devices are provided on the substrate. The circuit devices have respective active regions positioned at staggered known distances from the edge of the mask opening. Each of the plurality of circuit devices has a predicted on-state output current, a first source/drain region and a second source/drain region of a first conductivity type, and a gate electrode that extends to the opening and has a first impurity region of the first conductivity type and a second impurity region of a second and opposite conductivity type. Where the predicted on-state output current of a given circuit device exceeds an actual output current of the given circuit device, there is indication of an overlap between the first and second impurity regions of the gate electrode of the given device.

In accordance with another aspect of the present invention, a test circuit is provided that includes a semiconductor substrate and a mask on the substrate that has an opening with an edge. The opening is to enable impurity doping of selected portions of the test circuit. A plurality of field effect transistors are provided on the substrate that have respective active regions positioned at staggered known distances from the edge of the opening. Each of the plurality of field effect transistors has a predicted on-state output current, a first source/drain region and a second source/drain region of a first conductivity type, and a gate electrode that extends to the opening and has a first impurity region of the first conductivity type and a second impurity region of a second and opposite conductivity type. Where the predicted on-state output current of a given field effect transistor exceeds an actual output current of the given field effect transistor, there is indication of an overlap between the first and second impurity regions of the gate electrode of the given field effect transistor.

In accordance with another aspect of the present invention, a method of semiconductor processing is provided that includes forming a plurality of circuit devices on a semiconductor substrate with respective active regions positioned at staggered known distances from a reference line on the substrate. Each of the plurality of circuit devices has a predicted on-state output current, a first source/drain region and a second source/drain region of a first conductivity type, and a gate electrode. The gate electrode is formed with a first impurity region of the first conductivity type located over the active region. A mask is formed on the substrate that has an opening that exposes portions of each of the plurality of gate electrodes and an edge substantially coincident with the reference line. The exposed portions of each of the gate electrodes are implanted with an impurity of a second and opposite conductivity type to establish a second impurity region therein. The substrate is annealed to diffuse impurities of the second impurity regions toward the first impurity regions. The predicted on-state output current is compared with the actual output current for each of the plurality of circuit devices. Where the predicted on-state output current exceeds the actual output current of a given circuit device, there is indication of an overlap between the first and second impurity regions of the gate electrode of the given device.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
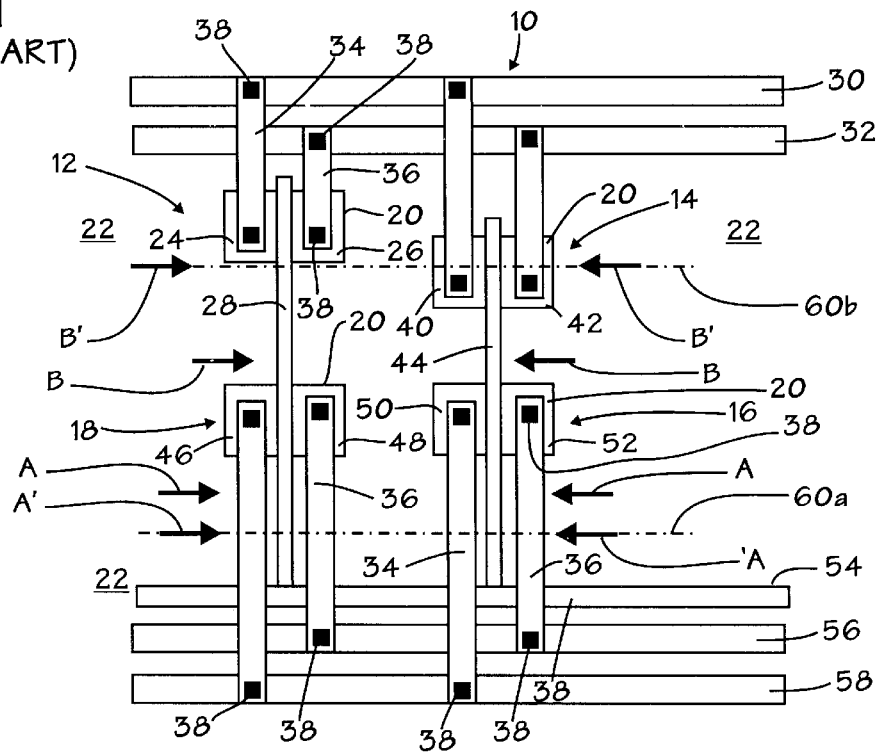
FIG. 1 is an overhead view of an exemplary conventional integrated circuit incorporating n-channel poly pre-doping.

In the drawings described below, reference numerals are generally repeated where identical elements appear in more than one figure. FIG. 1 is an overhead view of an exemplary conventional integrated circuit 10 incorporating n-channel poly pre-doping for the purpose of enhancing the performance of n-channel field effect transistors. Four transistors 12, 14, 16 and 18 are depicted. Each of the transistors 12, 14, 16 and 18 consists of an active region 20 of an underlying silicon substrate surrounded by isolation material 22, which is normally field oxide or oxide-based trench isolation material. The transistor 12 consists of source/drain regions 24 and 26 and an overlying gate electrode 28. The source/drain regions 24 and 26 are connected to metallization structures 30 and 32 by way of local interconnect structures 34 and 36 and contact structures 38. The transistor 14 similarly consists of source/drain regions 40 and 42 and an overlying gate electrode 44. The transistors 18 and 20 each consist of respective source/drain regions 46 and 48 and 50 and 52. The transistors 18 and 20 share the gate electrodes 28 and 44 with the transistors 12 and 14 respectively. The gate electrodes 28 and 44 are tied to a common metallization structure 54. Like the transistor 12, the transistors 14, 16 and 18 are tied to metallization structures 56 and 58 by local interconnect structures 34 and 36 and contact structures 38.

The transistors 12 and 14 are p-channel transistors while the transistors 16 and 18 are n-channel transistors, as is common in CMOS circuitry. In order to facilitate the operation of the n-channel transistors 16 and 18, a pre-doping implant has been performed to add n-type impurity to those portions of the gate electrodes 28 and 44 that are positioned in the vicinity of the device regions 20 of the transistors 16 and 18. The implant initially establishes n-type impurity concentrations in the gates 28 and 44 between the points A and B. However, subsequent annealing results in diffusion of the n-type impurities longitudinally through the gates 28 and 44 such that the n-type impurity concentrations therein extend from the points A' to B'. The dashed lines 60a and 60b respectively pass through the points A' to B' and illustrate the extent of n-type impurity diffusion in the gates 28 and 44.

FIG. 1 illustrates an undesirable consequence of performing a polysilicon pre-doping impurity implant using conventional techniques. Although the goal of the fabrication process is to load the gates 28 and 44 with n-type impurity only in the immediate vicinity of the device regions 20 for the n-channel transistors 16 and 18, note how the n-type doping encroaches into the active region 20 of the p-channel transistor 14. This unwanted encroachment of the p-channel transistor 14 by the n-type impurity results in a counterdoping of the portion of the polysilicon gate 44 controlling the p-channel transistor 14 and an attendant skewing of the operating characteristics thereof.

Figure 2:
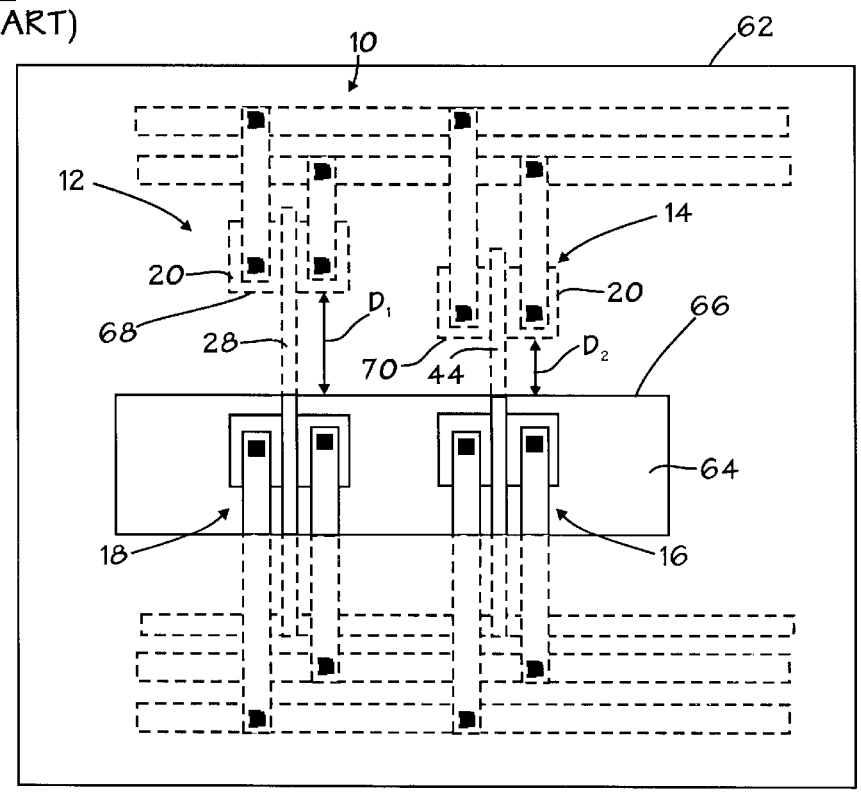
FIG. 2 is a plan view of the integrated circuit of FIG. 1 following fabrication thereon of a photomask with an implant window.

A typical conventional method for performing the poly pre-doping implantation of the n-channel devices 16 and 18 may be understood by referring now also to FIG. 2. FIG. 2 is a plan view of the integrated circuit 10 following fabrication thereon of a photomask 62 that is patterned with an opening 64. The opening 64 is patterned with a size and shape corresponding to the preferred pre-anneal boundaries, that is, the spacing between the points A and B, of the n-type impurity concentration in the gates 28 and 44 depicted in FIG. 1. The positioning of the edge 66 of the opening 64 in relation to the edges 68 and 70 of the active regions 20 of the transistors 12 and 14 is critical in determining whether or not there will be the undesirable overlap between the n-type impurity concentration and any of the transistors 12 and 14 as depicted in FIG. 1.

Following fabrication of the photomask 62, a n-type ion implant is performed to establish the n-type impurity concentrations between the points A and B in the gates 28 and 44 depicted in FIG. 1. Thereafter, the mask 62 shown in FIG. 2 is stripped and an anneal is performed, either dedicated to the activation of the implanted n-type impurity in the gates 28 and 44 or in conjunction with activation of the source/drain regions of the transistors 12, 14, 16 and 18. The lateral migration of the n-type impurity during the anneal toward the p-channel transistors 12 and 14 produces the undesirable overlap depicted in FIG. 1.

With the benefit of hindsight, it is apparent that the spacing $D_1$ between the transistor 12 and the edge 66 of the mask opening 64 is sufficient to avoid overlap while the spacing $D_2$ between the transistor 14 and the edge 66 is not sufficient and results in a performance degrading overlap between the diffused n-type impurity and the transistor 14. Currently, and as noted above, the positioning of the edge 66 of the opening 64 of the photomask 62 relative to the edges 68 and 70 of the p-channel transistors 12 and 14 is largely a matter of estimation.

Figure 3:
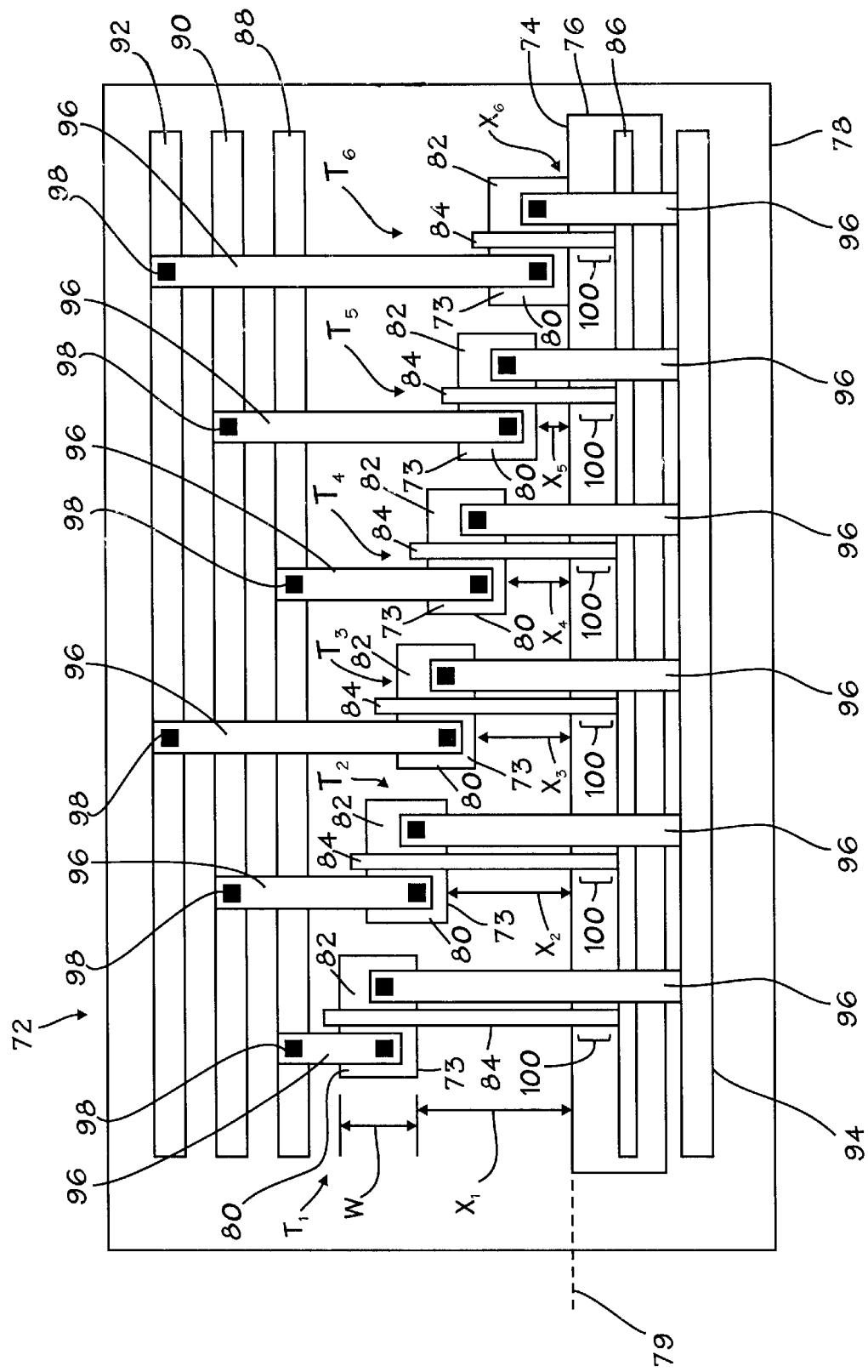
FIG. 3 is an overhead view of an exemplary embodiment of a test circuit suitable for determining the critical spacing between circuit devices and the edge of a pre-doping mask opening in accordance with the present invention.

An exemplary embodiment in accordance with the present invention of a test circuit 72 suitable for determining the critical spacing between circuit devices and the edge of a pre-doping mask opening may be understood by referring now to FIG. 3. FIG. 3 is an overhead view of the test circuit 72. A plurality of circuit devices, in this case field effect transistors $T_1, T_2, T_3, T_4, T_5$ and $T_6$, are fabricated on active regions 73 of a semiconductor substrate. The substrate may be composed of n-type silicon, p-type silicon, silicon-on-insulator or other well known types of substrate materials used in semiconductor device fabrication. The active regions 73 are positioned at staggered distances $X_1, X_2, X_3, X_4, X_5$ and $X_6$ from an edge 74 of an opening 76 of a pre-doping implant mask 78. For simplicity of illustration, and in contrast to the standard convention for the depiction of covered structures, the portions of the test circuit 72 that underlie the mask 78 are not shown in phantom.

The fabrication of the circuit devices $T_1$, $T_2$, $T_3$, $T_4$, $T_5$, and $T_6$ will precede the fabrication of the mask 78. Accordingly, the desired staggering of the active regions 73 relative to the edge 74 of the mask opening 76 will be achieved by laying out the active regions 73 relative to a reference line 79 that corresponds the position of the later-formed edge 74 of the mask opening 76.

The circuit devices $T_1$, $T_2$, $T_3$, $T_4$, $T_5$ and $T_6$ may each consist of source/drain regions 80 and 82 and an overlying gate electrode 84. The phrase "source/drain region(s)" is used herein to describe a region that may serve as either a source or a drain The skilled artisan will appreciate that a source/drain region may function as a source or a drain depending upon how it is interconnected with subsequent metallization. The source/drain regions 80 and 82 may be fabricated using well known implantation or diffusion techniques and may be either n-type or p-type. In the illustrative embodiment, the source/drain regions are p-type. The gate electrodes 84 may consist of patterned polysilicon, amorphous silicon or the like and may be patterned using well-known deposition, lithography and etching techniques. It is desirable for the circuit devices to mimic the structural and operating characteristics of active circuits so that the test circuit 72 will be predictive of the interplay of the mask opening 76 and the active device spacing therefrom. Each of the gate electrodes 84 will have an impurity region that corresponds to the conductivity type of the source/drain regions 80 and 82 and that is positioned at least over the active region 73.

The gate electrodes 84 may be commonly tied to a conductor structure 86 as shown. The source/drain regions 80 and 82 are connected to various metallization structures 88, 90, 92 and 94 via interconnect structures 96 and contact structures 98 as shown. Each of the circuit devices $T_1$, $T_2$, $T_3$, $T_4$, $T_5$ and $T_6$ may be fabricated with a lateral dimension W. Note that the layout of the interconnects between the source/drain regions 80 and 82 of the devices $T_1$, $T_2$, $T_3$, $T_4$, $T_5$ and $T_6$ is largely a matter of design discretion. In the illustrated embodiment, the source/drain regions 80 of two or more of the transistors $T_1$, $T_2$, $T_3$, $T_4$, $T_5$ and $T_6$ may be commonly connected as desired to one of the metallization structures, for example, the structure 80. However, if the source/drain regions of two or more of the devices $T_1$, $T_2$, $T_3$, $T_4$, $T_5$ and $T_6$ are commonly connected to one of the metallization structures 88, 90 or 92, then, as described more fully below, it is desirable to ensure that the commonly connected devices are positioned with a staggered spacing relative to the edge 74 of the mask opening 76. In other words, the gap $X_1$ should be greater than $X_4$ +W.

The mask 78 may be composed of well-known resist material and applied using well-known resist application techniques. Negative tone resist materials may be advantageously used to pattern the opening 76. Optionally, a hard mask of oxide or the like may be used.

Regions 100 of the gate electrodes 84 are provided with conductivity enhancing impurity by ion implantation through the mask opening 76. The pre-anneal boundaries of the regions 100 coincide with the reference line 79. The implanted impurity will have a conductivity type that is opposite to the conductivity type of the circuit devices $T_1$, $T_2$, $T_1$, $T_4$, $T_5$ and $T_6$. In one illustrative embodiment, the circuit devices $T_1$, $T_2$, $T_3$, $T_4$, $T_5$ and $T_6$ are implemented as p-channel field effect transistors and the implanted impurity is n-type. In this illustrative embodiment, phosphorus, for example, may be implanted at a dosage of about 1E15 to 1E16 ions/cm$^2$ and an energy of about 30 to 50 keV. However, the test circuit 72 may be optionally implemented with the circuit devices $T_1$, $T_2$, $T_3$, $T_4$, $T_5$ and $T_6$ as n-channel devices and a p-type impurity implanted through the opening 76. For example, boron, may be implanted with a dosage of about 1E15 to 1E16 ions/cm$^2$ and an energy of about 20 to 40 keV. In either case, the implant parameters should match those used for poly pre-doping implants used on active circuitry so that the test 72 will be predictive of active device processing.

Figure 4:
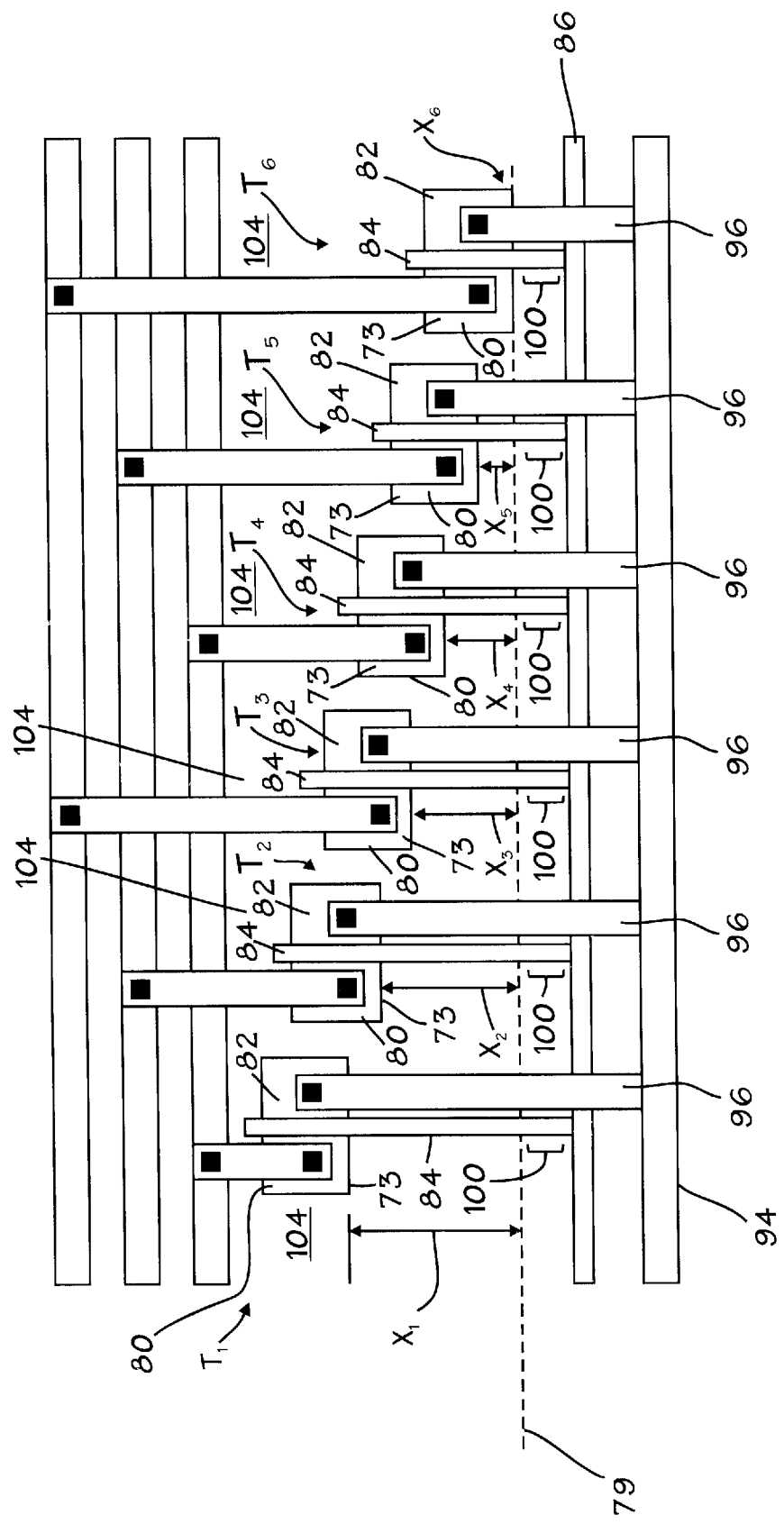
FIG. 4 is an overhead view like FIG. 3 depicting removal of the pre-doping mask to expose the previously covered portions of the test circuit in accordance with the present invention.

Referring now also to FIG. 4, the mask 78 depicted in FIG. 3 is stripped by ashing, solvent removal or a combination of these techniques to expose the previously covered portions of the test circuit 72. Note that the active regions 73 of the devices $T_1$, $T_2$, $T_3$, $T_4$, $T_5$ and $T_6$ are generally circumscribed by an isolation structure 104 that may be field oxide, trench isolation or the like. At this point, the gaps $X_1, X_2, X_3, X_4, X_5$ and $X_6$ between the devices $T_1$, $T_2$, $T_3$, $T_4$, $T_5$ and $T_6$ and the opposing boundary of the impurity regions 100, that is, the reference line 79, are substantially the same as the original spacings $X_1, X_2, X_3, X_4, X_5$ and $X_6$ between the edge 74 of the mask opening 76 depicted in FIG. 3.

Figure 5:
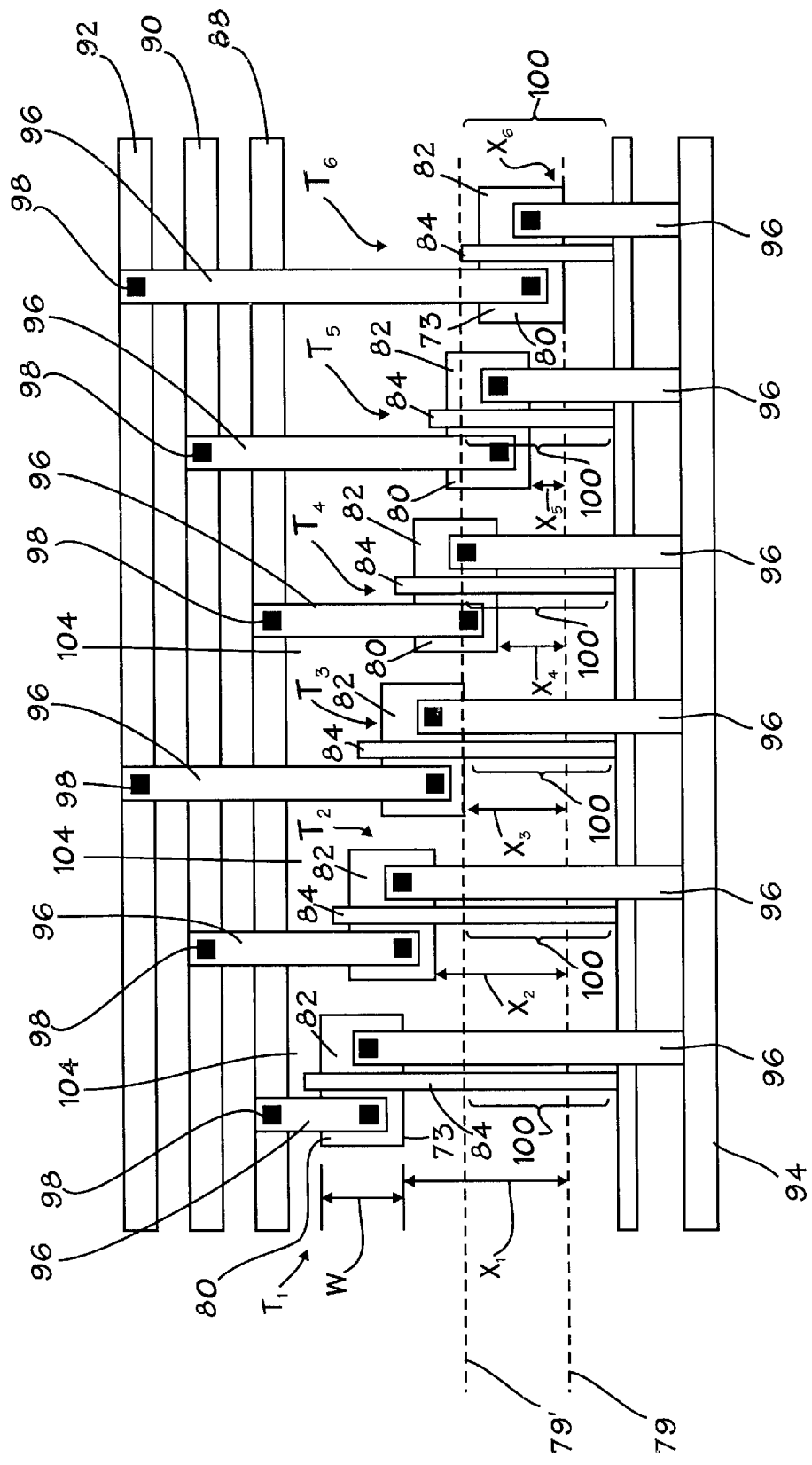
FIG. 5 is an overhead view like FIG. 4 depicting an anneal to activate the source/drain regions of the circuit devices of the test circuit in accordance with the present invention.

Referring now to FIG. 5, an anneal is performed to either activate the source/drain regions 80 and 82 of the devices $T_1$, $T_2$, $T_3$, $T_4$, $T_5$ and $T_6$ or to activate the implanted impurity regions 100 or both. The anneal produces an attendant longitudinal diffusion and expansion of the impurity loaded regions 100 from the original boundary 79 to the new boundary 79'. To illustrate the benefits of the present invention, it is assumed that the anneal-induced diffusion of the implanted gate impurities produces an overlap between the n-type impurity regions 100 of the gates 84 and all of the circuit device $T_6$, and portions of the devices $T_3$, $T_4$ and $T_5$, but no encroachment of the devices $T_1$, and $T_2$.

Following the anneal, electrical verification tests may be performed on the circuit devices $T_1$, $T_2$, $T_3$, $T_4$, $T_5$ and $T_6$ to determine which of those devices $T_1$, $T_2$, $T_3$, $T_4$, $T_5$, and $T_6$, if any, has been subjected to counterdoping as a result of the overlap. By determining which of the devices $T_1$, $T_2$, $T_3$, $T_4$, $T_5$ and $T_6$ is not subjected to overlap with the n-type impurity concentration 100, the closest of those devices $T_1$, $T_2$, $T_3$, $T_4$, $T_5$ and $T_6$ that is not overlapping will determine the minimum spacing between the edge 74 of the mask opening 76 as shown in FIG. 3 from the active transistor devices that are adjacent to an area undergoing poly pre-doping.

A variety of electrical parameters may be examined to identify the extent of counterdoping due to overlap. In an exemplary embodiment, the actual output current at saturation $I_{DSAT}$ of each device $T_1$, $T_2$, $T_3$, $T_4$, $T_5$ and $T_6$ is measured and compared to a predicted output current for each. The predicted output current for each device $T_1$, $T_2$, $T_3$, $T_4$, $T_5$ and $T_6$ is based on the device parameters for each, such as initial substrate and well doping levels, gate and channel length, source/drain concentrations etc. Power is applied to the devices $T_1$, $T_2$, $T_3$, $T_4$, $T_5$ and $T_6$ and the output current $I_{DSAT}$ of each is measured with microprobing. Unless the source to drain potentials $V_{SD}$ applied to the devices $T_1$, $T_2$, $T_3$, $T_4$, $T_5$ and $T_6$ are quite high, it is anticipated that the devices that are fully overlapped or substantially overlapped, such as the devices $T_5$ and $T_6$, will not turn on when their respective gate electrodes 84 are biased with respect to the substrate. Thus, their respective output currents will be essentially zero or close to zero depending upon the level of leakage currents. The actual output and predicted output currents for the devices $T_1$ and $T_2$ should correspond since there will be no counterdoping effect as a result of encroachment by the impurity region 100. Thus, the shorter of the gaps $X_1$ and $X_2$, namely, $X_2$, represents the minimum safe design gap for poly pre-doping mask edge placement.

The situation for the devices $T_3$ and $T_4$ is slightly more complex. Devices $T_3$ and $T_4$ will experience some performance change due to partial overlap and counterdoping by the impurity concentrations 100. The extent of partial overlap for the devices $T_3$ and $T_4$ may be determined by determining the actual output current $I_{DSAT}$ of the devices and dividing those values by the predicted output current/unit width of the devices $T_3$ and $T_4$. In addition to knowing the predicted output current for each of the devices $T_1$, $T_2$, $T_3$, $T_4$, $T_5$ and $T_6$, the predicted output current per unit width is simply the predicted output current divided by the width W of the devices $T_1$, $T_2$, $T_3$, $T_4$, $T_5$ and $T_6$. For example, the n-type impurity concentration 100 overlaps the active region 79 of the device $T_4$ by approximately one-half. Thus, it may be expected that the output current of the device $T_4$ will be approximately one-half of the predicted output current. The extent of overlap may then be estimated by dividing the actual output current of the device $T_4$ by the anticipated output current/unit of width.

Optionally, other parameters indicative of property changes in the circuit devices $T_1$, $T_2$, $T_3$, $T_4$, $T_5$ and $T_6$ may be used to determine overlap between the impurity region 100 and any of the given devices $T_1$, $T_2$, $T_3$, $T_4$, $T_5$ and $T_6$. For example, the source to drain resistance for each of the devices $T_1$, $T_2$, $T_3$, $T_4$, $T_5$ and $T_6$ may be measured and used as a means of determining presence of counterdoping due to overlap.

Figure 6:
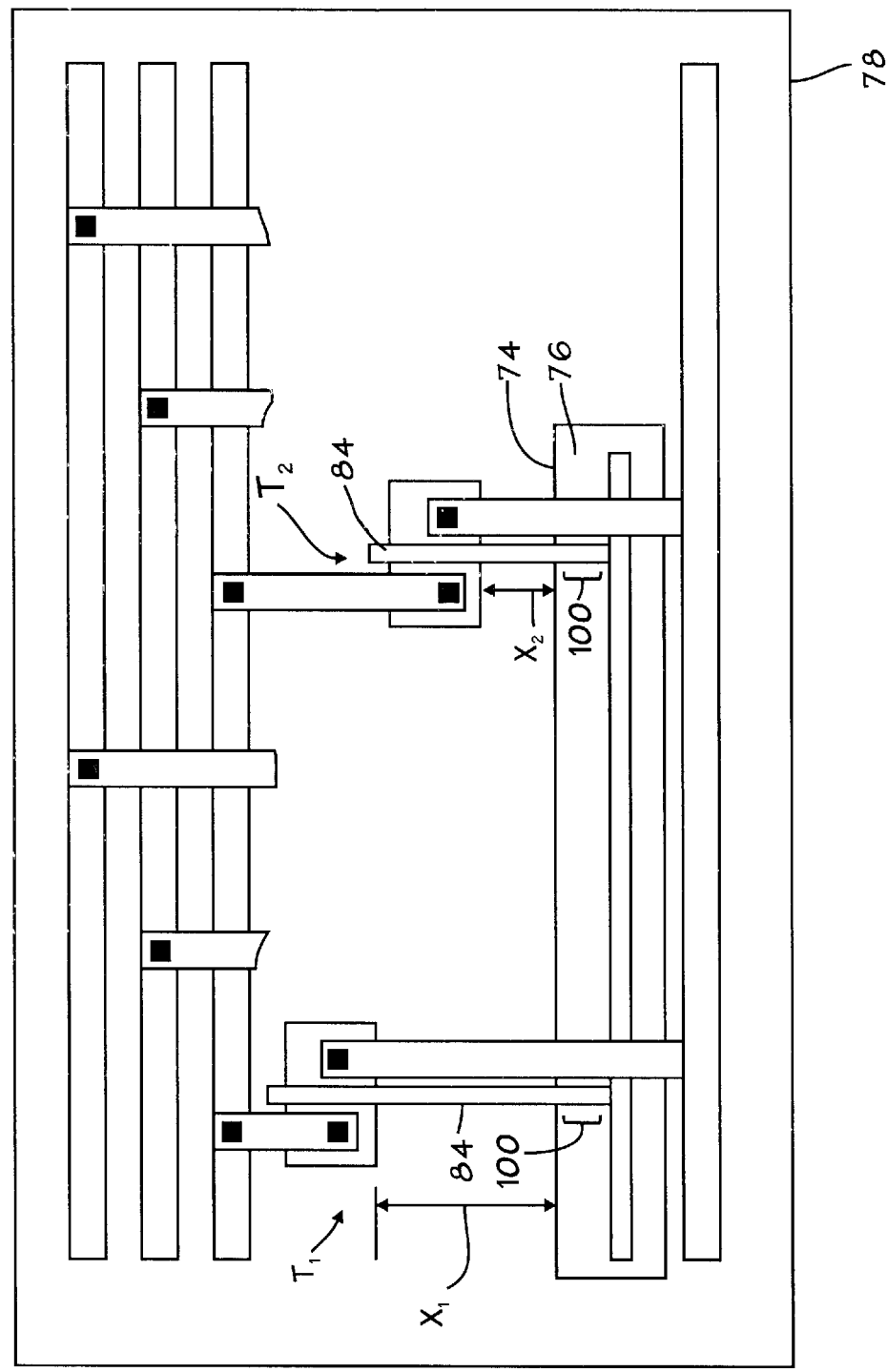
FIG. 6 is an overhead view of an alternate exemplary embodiment of a test circuit suitable for determining the critical spacing between circuit devices and the edge of a pre-doping mask opening in accordance with the present invention.

The illustrative embodiment depicted in FIGS. 3, 4 and 5 utilizes a total of six circuit devices, namely, $T_1$, $T_2$, $T_3$, $T_4$, $T_5$ and $T_6$. However, the skilled artisan will appreciate that the benefits of the present invention may be obtained using two or more circuit devices. For example, and as shown in FIG. 6, which is a plan view like FIG. 3 of an alternate exemplary embodiment of the test circuit 72', two circuit devices $T_1$ and $T_2$ are patterned on the substrate with staggered spacings from the edge 74 of the mask opening 76 as shown. The devices T, and $T_2$ may be substantially identical to the devices $T_1$, and $T_2$ described above and for simplicity of illustration, the multiplicity of element numbers shown in FIG. 3 are eliminated from FIG. 6. A poly pre-doping implant may be performed through the mask window 76 to establish impurity concentrations 100 in the gates 84 as generally described above. The aforementioned technique for determining the extent of overlap between the impurity concentrations 100 and the circuit devices T, and $T_2$ following anneal may be used to determine whether the spacing $X_1$ or $X_2$ represents the minimum safe spacing between the mask edge 74 of the opening 76.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A test circuit, comprising:

a semiconductor substrate;

a mask on the substrate having an opening with an edge, the opening to enable impurity doping of selected portions of the test circuit;

a plurality of circuit devices on the substrate having respective active regions positioned at staggered known distances from the edge of the opening, each of the active regions having a second edge and a width measured from its second edge in a direction away from the first edge of the mask opening, the known distance between a given active region and the first edge of the mask opening differing from the staggered known distances between the other active regions and the first edge of mask opening by at least the width, each of the plurality of circuit devices having a predicted on-state output current, a first source/drain region and a second source/drain region of a fist conductivity type, and a gate electrode, the gate electrode extending to the opening and having a first impurity region of the first conductivity type and a second impurity region of a second and opposite conductivity type; and whereby the predicted on-state output current of given circuit device exceeding an actual output current of the given circuit device being indicative of an overlap between the second impurity region of the gate electrode and the active region of the given device.

2. The test circuit of claim 1, wherein the predicted on-state output current comprises the predicted drain saturation current.

3. The test circuit of claim 1, wherein the lesser of the staggered known distances in which there is no overlap between the second impurity region and the active region of a given device defines a minimum desirable spacing between the first edge of the mask opening and an active circuit device.

4. The test circuit of claim 1, wherein the first conductivity type comprises p-type and the second conductivity type comprises n-type.

5. The test circuit of claim 1, wherein the first source/drain regions of each of the plurality of circuit devices being commonly connected to a conductor.

6. A test circuit, comprising:

a semiconductor substrate;

a mask on the substrate having an opening with an edge, the opening to enable impurity doping of selected portions of the test circuit;

a plurality of field effects transistors on the substrate having respective active regions positioned at staggered known distances from the edge of the opening, each of the plurality of field effect transistors having a predicted on-state output current, a first source/drain region and a second source/drain region of a first conductivity type, and a gate electrode, the gate electrode extending to the opening and having a first impurity region of the first conductivity type and a second impurity region of a second and opposite conductivity type, each of the active regions having a second edge and a width measured from its second edge in a direction away from the first edge of the mask opening, the known distance between a given active region and the first edge of the mask opening differing from the known distances between the other active regions and the first edge of mask opening by at least the width; and whereby the predicted on-state output current of a given field effect transistors exceeding an actual output current of the given field effect transistors being indicative of an overlap between the second impurity region and the active region of the given field effect transistor.

7. The test circuit of claim 6, wherein the predicted on-state output current comprises the predicted drain saturation current.

8. The test circuit of claim 6, wherein the lesser of the known distances in which there is no overlap between the second impurity region and the active region of a given field effect transistor defines a minimum desirable spacing between the first edge of the mask opening and an active field effect transistor.

9. The test circuit of claim 6, wherein the first conductivity type comprises p-type and the second conductivity type comprises n-type.

10. The test circuit of claim 6, wherein the first source/drain regions of the plurality of field effect transistors are commonly connected to a conductor.

11. The test circuit of claim 6, wherein the second source/drain regions of two of the plurality of field effect transistors being commonly connected to a conductor, the two field effect transistors having a width measured from their second edges in a direction away from the first edge of the mask opening, the known distance between one of the two field effect transistors and the first edge of the mask opening differing from the known distance between the other of the two field effect transistors and the first edge of the mask opening by at least the width.

12. A test circuit, comprising:
a semiconductor substrate;
a mask on the substrate having an opening with an edge, the opening to enable impurity doping of selected portions of the test circuit;
a plurality of circuit devices on the substrate having respective active regions positioned at staggered known distances from the edge of the opening, each of the plurality of circuit devices having a predicted on-state output current, a first source/drain region and a second source/drain region of a first conductivity type, and a gate electrode, the gate electrode extending to the opening and having a first impurity region of the first conductivity type and a second impurity region of a second and opposite conductivity type, wherein the second source/drain regions of two of the plurality of circuit devices are commonly connected to a conductor, the active regions of the two circuit devices having a second edge and a width measured from their second edges in a direction away from the first edge of the mask opening, the known distance between the active region of one of the two circuit devices and the first edge of the mask opening differing from the known distance between the active region of the other of the two circuit devices and the first edge of the mask opening by at least he width, and whereby the predicted on-state output current of a given circuit device exceeding an actual output current of the given circuit device being indicative of an overlap between the second impurity region of the gate electrode and the active region of the given device.

13. The test circuit of claim 12, wherein the predicted on-state output current comprises the predicted drain saturation current.

14. The test circuit of claim 13, wherein the lesser of the staggered known distances in which there is no overlap between the second impurity region and the active region of a given device defies a minimum desirable spacing between the first edge of the mask opening and an active circuit device.

15. The test circuit of claim 13, wherein the first conductivity type comprises p-type and the second conductivity type comprises n-type.

16. The test circuit of claim 13, wherein the first source/drain regions of each of the plurality of circuit devices being commonly connected to a conductor.

* * * * *

UNITED STATES PATENT AND TRADEMARK OFFICE
CERTIFICATE OF CORRECTION

PATENT NO.    : 6,469,316 B1
DATED         : October 22, 2002
INVENTOR(S)   : John J. Bush et al.

It is certified that error appears in the above-identified patent and that said Letters Patent is hereby corrected as shown below:

Column 8,
Line 64, insert -- the -- between the words "of" and "mask";

Column 10,
Line 16, delete the word "he" and substitute the word -- the -- therefor; and
Line 29, delete the word "defies" and substitute the word -- defines -- therefor.

Signed and Sealed this

Thirteenth Day of May, 2003

JAMES E. ROGAN
*Director of the United States Patent and Trademark Office*